United States Patent [19]
Ramsey et al.

[11] Patent Number: 5,646,447
[45] Date of Patent: Jul. 8, 1997

[54] TOP LOADING CAM ACTIVATED TEST SOCKET FOR BALL GRID ARRAYS

[75] Inventors: James Michael Ramsey, Sellersburg, Ind.; Paul S. Chinnock, Phoenix; Maria E. Ryan, Scottsdale, both of Ariz.

[73] Assignee: PCD Inc., Peabody, Mass.

[21] Appl. No.: 657,517

[22] Filed: Jun. 3, 1996

[51] Int. Cl.$^6$ .................. H01L 23/48; H01L 23/52; H01L 29/40; H01L 23/34
[52] U.S. Cl. .................. 257/727; 257/780; 439/331
[58] Field of Search .................. 257/727, 726, 257/693, 698, 699, 710, 738, 780, 786, 692; 439/330, 331, 525, 526, 70, 72

[56] References Cited

U.S. PATENT DOCUMENTS

| | | | |
|---|---|---|---|
| 4,692,790 | 9/1987 | Oyamada | 257/727 |
| 5,451,816 | 9/1995 | Abe et al. | 257/727 |
| 5,545,050 | 8/1996 | Sato et al. | 439/331 |

*Primary Examiner*—Carl W. Whitehead
*Assistant Examiner*—S. V. Clark
*Attorney, Agent, or Firm*—Edwin H. Paul; Jerry Cohen

[57] ABSTRACT

A socket for a ball grid array integrated circuit package (BGA) with an array of electrical contacts (*12) that extend through holes in a slidable plate. The arrangement of spacing the holes (14) and the electrical contacts therein provide entry openings that allow the ball contacts (16) of a BGA package to enter the openings. The contacts are cupped or angled to mate with the side and top of the ball contacts of the ball grid array package. The contact surface of the ball grid array package is vertically inserted into the socket without any interfering structure, and there are guide surfaces to align the ball contacts with the openings. The plate (3) is driven parallel to the plane of the ball contacts in a manner that reduces the entry hole opening by means of a rotating cam placed at one end rotated by a torsion spring. This reduced entry opening is arranged and constructed such that with a ball contact inserted therein, electrical conductivity is provided between the ball contact and the socket electrical contact, and further contact occurs where the cupped ends are bifurcated with sharp edges that penetrate any oxidation on the ball contacts. The angled or cupped ends (24) of the socket contacts mate with the ball contacts near where the ball contacts attach to the BGA package body. This mating is at or above the equator of the ball contacts and serves to retain the ball and the BGA package itself in the socket. No other forces are acting on the BGA package. Torsion springs provide the rotation force via a cam handle to rotate the cam from a position for package insertion to one of ball contact electrical connection with socket contacts. The lid of the socket is a frame around an opening through which the BGA package enters. This frame contacts the cam handle and pressing down on the frame provides the driving force that rotates the cam to the open position allowing the slidable plate to move toward the low profile of the cam with aid of a compression spring. When the torsion springs rotate the cam axle from the open position to the actuated position and the slidable plate drives the BGA contacts into contact with the socket contacts, the BGA package is retained for test or burn-in or other uses. The open position for BGA insertion also allows BGA removal. Operation is that the lid is pushed down and the BGA package is guided with no or zero insertion force into the socket where the ball contacts enter the holes. Releasing the pressure allows the cam to rotate to the larger cam profile causing the slidable plate to be driven and the ball contacts to be pinched between the socket contact angled ends and the side wall surfaces of the holes thereby retaining the BGA package within the socket and making reliable electrical connections to the ball contacts.

7 Claims, 8 Drawing Sheets

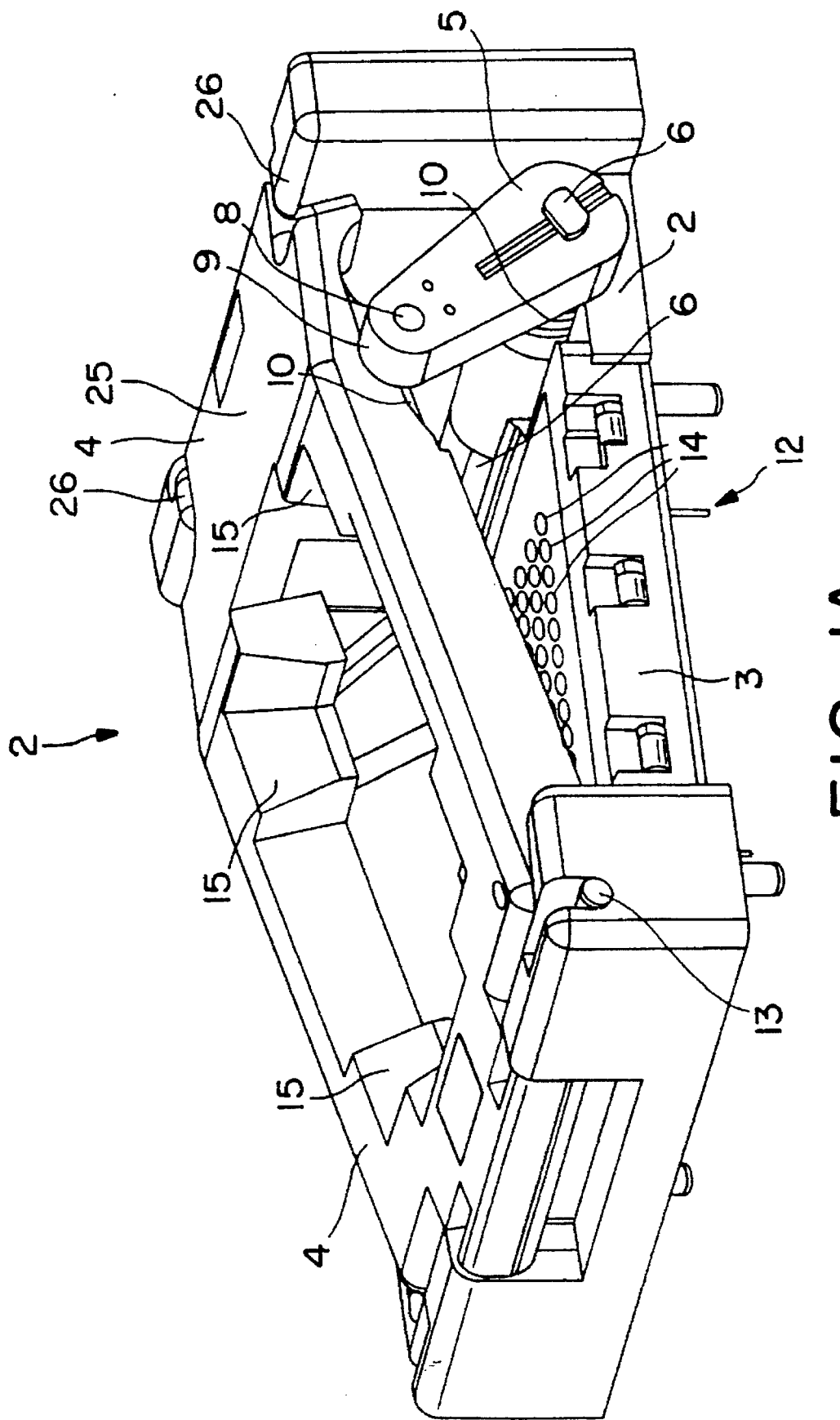
FIG. IA

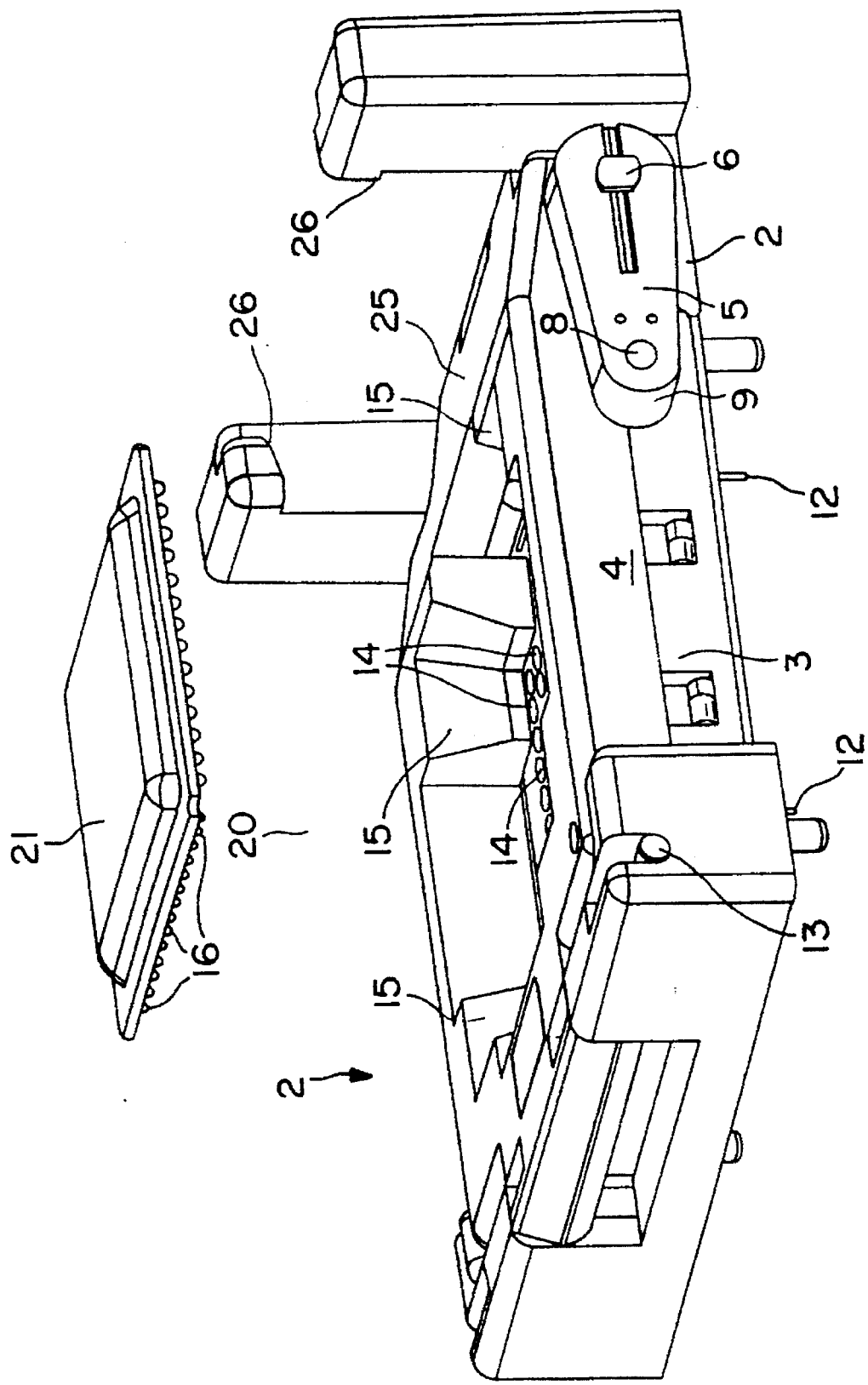
FIG. IB

TOP LOADING CAM ACTIVATED TEST SOCKET FOR BALL GRID ARRAYS

This application is related to allowed U.S. patent application Ser. No. 08/510,763, filed Aug. 3, 1995, of the same title and of common assignment with the present application. This allowed Patent Application claimed priority under 35 U.S.C. 119(e) on the Provisional Application filed on Jul. 10, 1996.

FIELD OF THE INVENTION

The present invention relates to sockets for surface mounted, high pin count integrated circuit packages, and more particularly to test and burn in sockets for ball grid array integrated circuit packages.

BACKGROUND OF THE INVENTION

Surface mounted, high pin count integrated circuit packages have been dominated by quad flat packs (QFP's) with various pin configurations, for example, leadless, J-leaded, and gull wing leaded. These packages have closely spaced leads for making electrical connections distributed along the four peripheral edges of the flat packages. These packages have become limited and grown prohibitively large because the pins or electrical leads are confined to the edges of the flat packages. To address this limitation, a new package, a ball grid array (BGA) is not so confined because the electrical contact points are distributed over the entire bottom surface of the packages. More contact points can be located with greater spacing than with the QFP's. These contacts are solder balls which facilitate flow soldering of the packages onto a printed circuit board. BGA's are popular alternatives to QFP's.

Sockets that accept BGA's are necessary for testing, burn-in, re-programming, and sometimes for production use where the integrated circuit may need replacing. Several such sockets have been developed by various manufacturers to satisfy this need. Most of these sockets are of a clam shell design, where a hinged top opens to allow package entry, and closing the top retains the package within the socket. The socket includes a bed of contacts spaced to match the BGA contacts and a top located spring or spring loaded surface is arranged to press the package onto the bed of contacts to ensure electrical connection for all the contacts. Some of the prior art BGA sockets align the IC contacts in holes in a printed circuit board. The contacts are arranged to extend through the holes to the other side of the printed circuit board where electrical connections are made. Such an arrangement of surrounding the contacts within holes and enclosing the BGA packages within the socket has the undesirable feature of retaining heat in the BGA packages during test or burn-in. In addition, this arrangement prevents heat sinks from being mounted onto the BGA package.

Such prior art sockets may be adequate for small scale handling of BGA packages, but, because of the many separate and complex physical actions needed to insert, test, and extract the BGA package, such clam shell sockets are: costly, unwieldy, and unreliable when used for production processing large numbers of BGA packages.

Another limitation of many available BGA sockets occurs since the socket contacts place forces onto the IC contacts in the same direction. These forces drive one side of the package against an abutment of the socket. The deflected socket contacts are opposed by the IC BGA contacts with the strength of the BGA package keeping the individual package contacts in their correct position. With a large number of contacts this cumulative force of many deflected contacts is very large and may physically damage the package.

It is an object of the present invention to provide a BGA socket needing few and simple physical operations to insert and extract an IC package. An additional object of this invention is to provide low resistance electrical contact to the package contacts by using uniquely shaped socket contacts that present sharp edges for high contact point interface pressure. A related object is to provide the package low resistance electrical contact during variations of socket temperature, shock, and vibration by using the socket contact shape for retention of the package's ball contacts. It is another object to provide short electrical current paths for the BGA package contacts through the socket contacts to the underlying printed circuit board.

Yet another object of the present invention is to provide a point of contact between the socket contact and the IC package ball contact that is above or near the BGA contact spherical ball equator and not in contact on the lower part of the ball such that the ball bottom surface is unaltered or deformed so that the BGA package will not be impaired for soldering to a printed circuit board or other such final end use.

It is another object of the present invention to provide a socket where there only substantial mechanical forces on the individual BGA ball contacts while no force is applied to the BGA package itself as a whole.

It is yet another object of the present invention to provide a BGA socket with no obstructions that need to be avoided when inserting and extracting the BGA package.

It is another object to provide a BGA socket that provides superior heat dissipation capabilities.

SUMMARY OF THE INVENTION

The foregoing objects are met in a socket for test and burn in of ball grid array packages including a top structure defining an opening large enough to allow the ball grid array package to pass through with the ball contacts facing downward, the lower ball surfaces defining a plane. For descriptive purposes herein the end of the ball contacts remote from the BGA package body is considered a bottom pole and the top of the ball contact connected to the BGA package a top pole with an equator encircling the ball equidistant from the poles and parallel to said plane. There is a plurality of electrical contacts fixed to said socket base with a first end arranged to mate with the ball contacts, a slidable plate with through holes through which said electrical contacts extend forming openings between the contact first ends and the opposing edges or walls of said holes for which the BGA ball contacts are inserted in-between, a cam axle means arranged to provide a displacement to said slidable plate in a direction parallel with said plane, reducing the said hole openings, such that interposing BGA ball contacts are pushed into said socket electrical contacts and captured between the hole edges and contact first ends. There are compression spring means for driving said plate against the said cam axle such that in the open position the cam axle lower profile provides openings between the edges of said holes and each of said electrical contacts suitable for removal and insertion of said package ball contacts. Removal of the external force applied downward to rotate the cam axle to the open position results in the cam axle rotating to the actuated or cam thick position motivated by torsion spring means thereby moving the slidable plate such that said ball contacts are driven into electrical continuity with said electrical contacts.

In a preferred embodiment the socket electrical contact includes a cupped and bifurcated or forked end. The forked extensions have edges which contact the BGA ball contacts above the balls' equators providing a detent action on the ball contacts which are thereby retained. When such connections are made to the ball contacts the BGA package is retained in the socket and the socket is arranged such that the forces of the cam axle and socket contacts pinching the BGA balls are isolated to the BGA ball contacts and not acting on the BGA package as a whole cumulatively. The frame shaped lever arm or said top structure is not in contact with the BGA package when the BGA package is so retained in the socket.

In a preferred embodiment, the means for driving the sliding plate containing the array of holes includes a cam axle rotated by a top structure lever arm extension in contact with a cam axle handle, and the lever arm extension is angled above said socket, and where the lever arm extension is arranged on the periphery of the socket such that the lever arm does not interfere with the open top insertion and extraction of the integrated circuit, and where said lever arm has a surface in contact with the cam axle handle such that depressing the lever arm rotates the cam axle and enlarges the distance between the sockets contacts and the opposing surfaces of the corresponding holes such as to allow insertion or removal of the ball contacts into said hole. The lever arm extension has guide surfaces chamfered to align the BGA package and its corresponding BGA contacts with the holes and adjacent to the electrical contacts of the socket while the lever arm extension is depressed, and further that the lever arm extension when not depressed does not contact the retained BGA package. The top structure is open above the BGA package to allow cooling air to circulate around the BGA package and/or heat sinks to be attached thereto.

In a preferred embodiment there is a torsional spring that returns the cam axle handle and the lever arm extension to there initial angled position—the rest position with no external forces exerted. This action rotates the cam which displaces the slidable plate which drives the interposing BGA ball contacts into the electrical contacts of the socket. The position of the socket with the lever arm extension is depressed is termed the open position.

Other objects, features and advantages will be apparent from the following detailed description of preferred embodiments thereof taken in conjunction with the accompanying drawings in which:

BRIEF DESCRIPTION OF THE DRAWINGS

FIG. 1B is a perspective view of a preferred embodiment of the present invention with the frame/lever depressed;

DETAILED DESCRIPTION OF PREFERRED EMBODIMENTS

Figures 1, 2A:
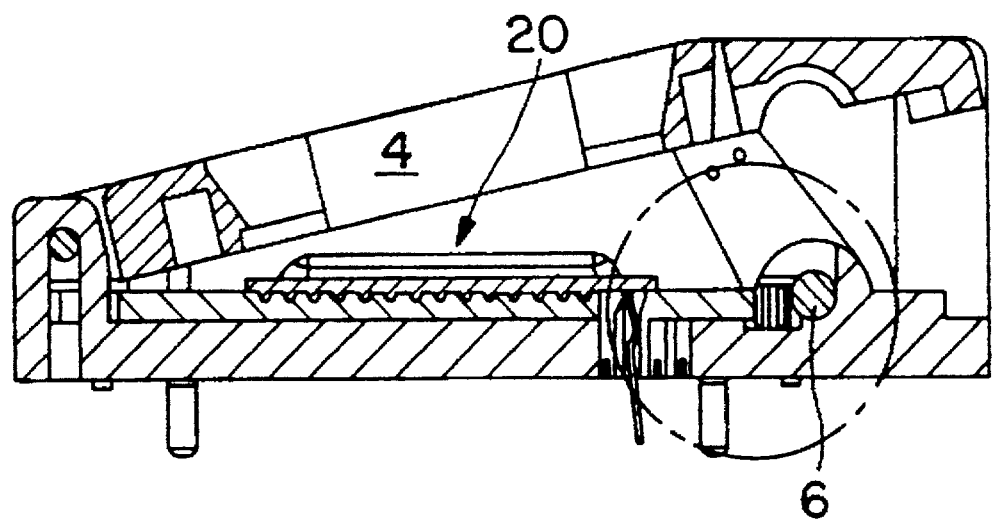
FIG. 1 is a perspective view of a preferred embodiment of the present invention in the BGA engaged position.
FIG. 2A is a side view of the slidable plate, socket contacts, BGA ball contacts, and the cam axle in the rest position.
Figures 2, 2A:
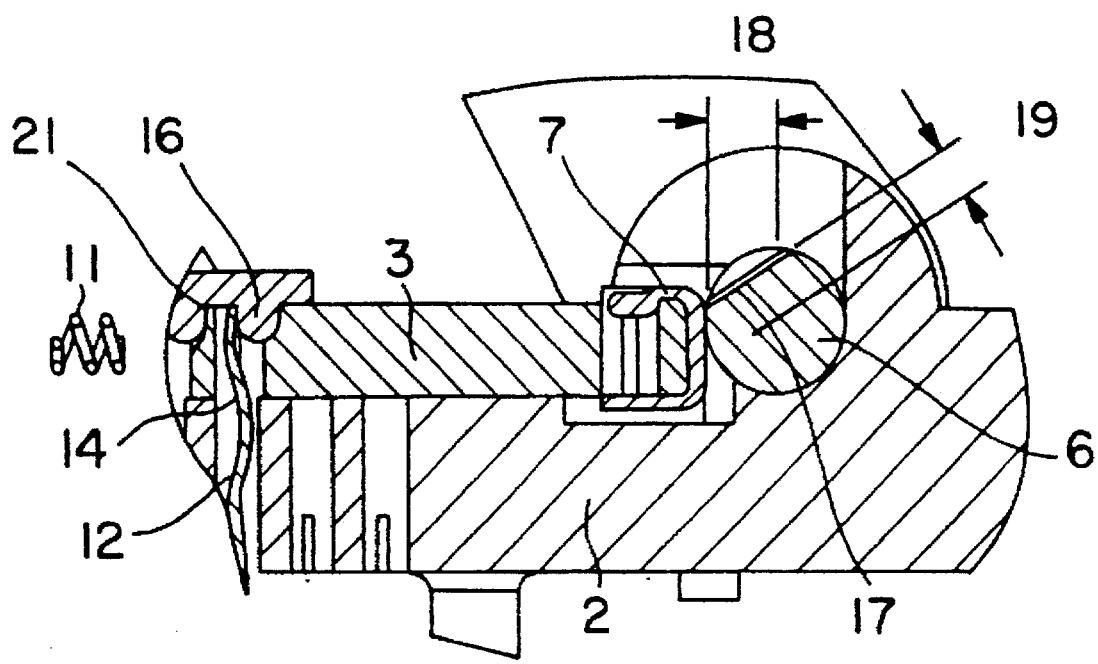

FIG. 1A and 1B are perspective views of a socket 2 made in accordance with the present invention. The socket itself is constructed from dielectric insulating materials, that are well known in the art, and the electrical contacts 12 are made of materials that are also well known in the art. There is a slidable plate 3 populated with through holes 14 where elongated contacts 12 extend upward into each hole. In this embodiment, the top structure includes an extension and lid, which form a lever arm 4 that pivots along one edge of the socket about a lid axle 13 constructed opposite the cam axle 6 that traverses the socket. A portion of the lid remote from the lid axle is arranged to contact slide pins 8, or, alternatively but not shown, cam handle rounded surfaces 9 located at the ends of the cam axle handles 5. The contacting rotates the cam axle during the socket opening process. The lever arm 4 is manufactured as a frame around the periphery of the socket external from the BGA package insertion area 20. The corners of the inner surfaces of the frame lever arm have chamfered surfaces 15 that guide the package 21 into the socket in an aligned position. FIG. 1B shows the socket in the open position, the frame lever arm is depressed to be parallel with the slidable plate 3. A BGA package comes in contact with the chamfered edges which positions the corners of the BGA package such that the ball contacts 16 each enter a corresponding hole 14 in the plate.

When inserting or removing the BGA package from the socket, the frame lever arm, as shown in FIG. 1B—the open position, encircles and does not encroach on the area 20 so as to not interfere with the BGA package insertion or removal.

In FIG. 1A, the cam axle torsion springs 10 act to return the cam axle handles 5 and the frame lever arm 4 back to the BGA engaged position—where the BGA package, if inserted, is retained in the socket. The frame lever arm 4 extends beyond the cam axle 6 to provide a large press down area 25 for ease of operation. The frame lever arm travels upwards until stops 26 built into the base stop the upward travel.

Figures 1, 2B:
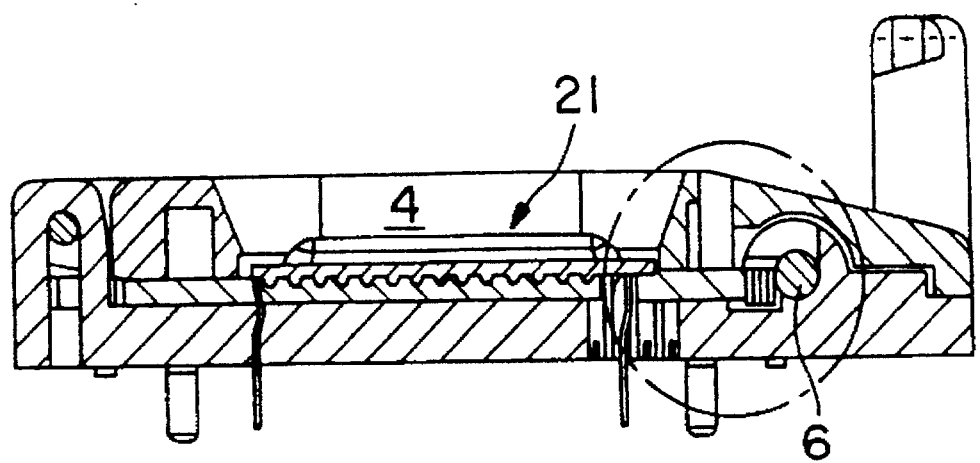
FIG. 2B is a side view of the slidable plate, socket contacts, BGA ball contacts, and the cam axle in the open position.
Figures 2, 2B:
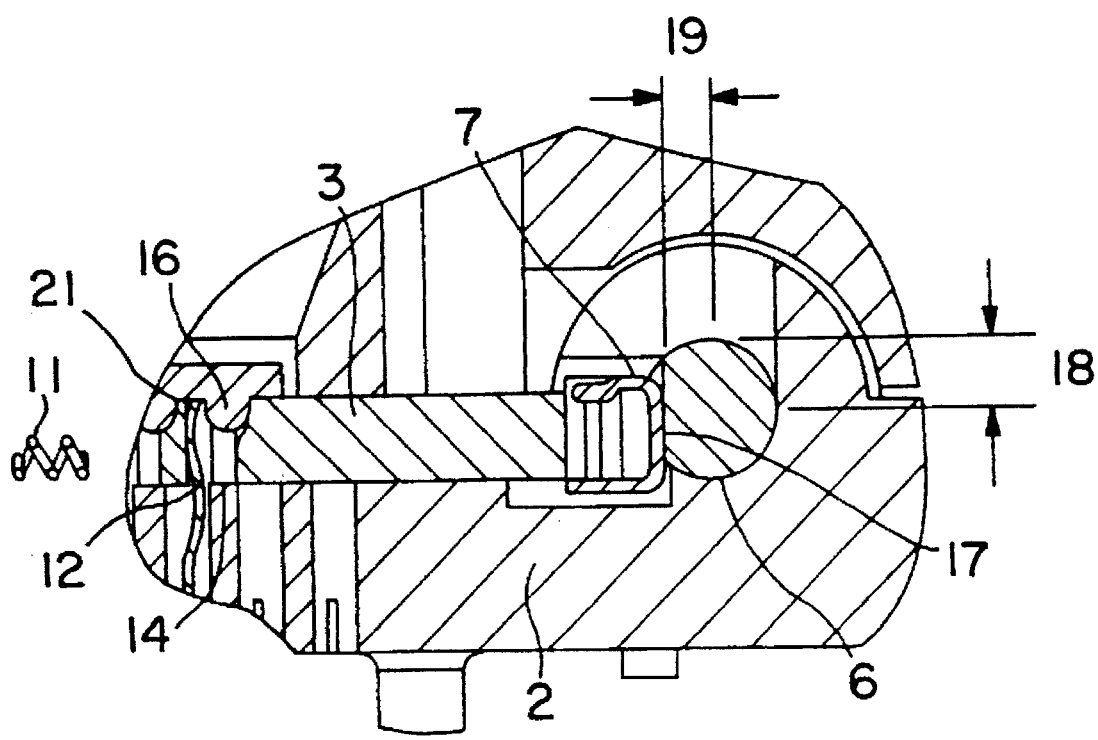

FIGS. 2A and 2B show the operation of the cam axle 6. This preferred embodiment is one example of the many variations of cams, cam followers, and cam handles with spring actions known in the art. Referencing FIG. 2A the cam axle 6 is positioned at an angle as to push the strike plate 7, that is attached to the slidable top plate 3, to a position corresponding to the greatest radius 18 of the cam axle. FIG. 2B shows the frame lever arm depressed downward flat against the top plate 3. The cam axle 6 via the cam handle 5 is rotated as shown. The flat of the cam 17 is positioned parallel to the strike plate 7 resulting in the top plate return spring 11 moving the top plate 3 toward the cam axle 6. In the open position shown in FIG. 2B, the through holes 14 are positioned such that the socket contacts 12 are against one wall of the hole to allow the ball contacts 16 to enter or exit the holes. The balls are positioned between the socket contacts and the opposing surface of the holes 21. The top plate return spring 11, as shown, can be positioned at different locations along the top plate edge remote from the cam axle, or several springs may be positioned along this remote edge. Also a coil spring 11 is shown, but leaf springs or other such springs known in the art may be used.

Referring back to FIG. 1B, the frame lever arm 4 has chamfered surfaces 15 which engage the corners of the BGA package 21 and guide the package to align the ball contacts 16 with the holes 14. With reference first to FIG. 2B and then 2A, the movement of the top plate 3 moves the hole surfaces 21 that then move the ball contacts into the socket contacts 12 making electrical connections thereto. The travel distance of the top plate 3 is determined by the difference between the cam axle outside radius 18 and the distance (normal to the flat a 90°) from the cam flat 17 to the cam axle center of rotation. The cam handle torsion springs 10 return the cam to the engaged position after removal of the downward pressing force on the frame lever arm 4. The top plate 3 is retained in the plane parallel with the base 2 by any of well known in the art mechanical designs. The socket contacts 12 extend through the base plate 2 with additional length for insertion into a printed circuit board and soldering.

Still referring to FIG. 1A and FIG. 1B, the frame lever arm or lid 4 is limited in its upward direction by two stops 26 that are built into the base 2. The lower section 10 of the lid engages a slide pin 8 that rotates with the cam handle 5 under the lower section 10 of the lid. The embodiment of the pin 8 does not traverse the entire socket, however, there is another pin, not shown, on the corresponding to other side of the socket that engages a corresponding lower section of the lid. In another preferred embodiment, mentioned above and not shown, the lid lower section engages the rounded surface 9 of the cam handle 5.

Figure 3A:
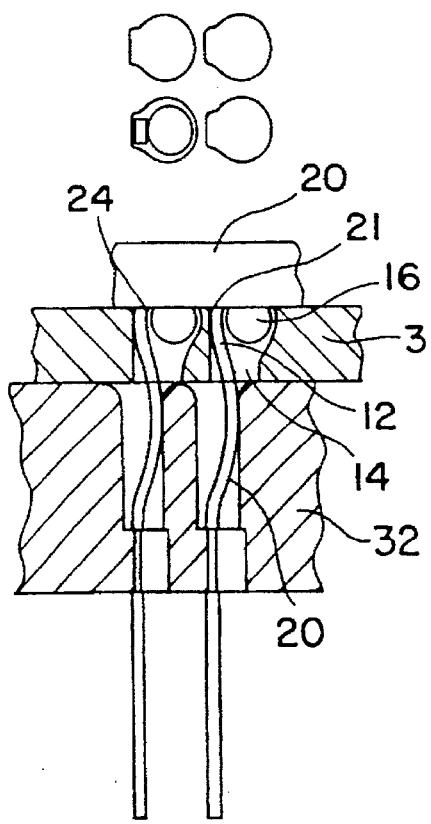
FIG. 3A is a side view detail showing the ball contact, the slidable plate, and the socket contacts with the socket in the open position.
Figure 3B:
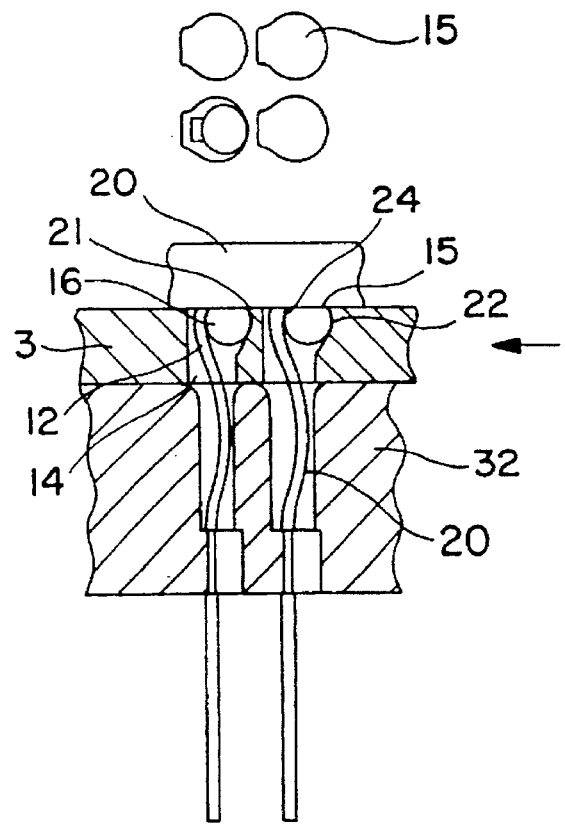
FIG. 3B is a side view detail showing the ball contact, the slidable plate, and the socket contacts with the socket in the rest or engaged position.

FIG. 3B shows an individual top plate hole with an opening 15 with a BGA package inserted in the engaged position. The holes have walls 21 that have been moved as shown comparing FIG. 3A to FIG. 3B, and as described above, to contact the balls and to move the balls into contact with the socket contacts 12. The movement of the holes and corresponding balls causes the socket contacts to deflect so as to make reliable electrical connections therebetween and to secure the balls and so the BGA package to the socket. The socket contact deflection is seen by the movement of the surface 20 of the socket electrical contacts away from the housing structure 32. The length of the contact is designed along with other details of the socket contact to ensure proper spring force of the deflected socket contact. These are the only forces on the BGA since, as seen in FIG. 2A, the frame lever arm has moved above and away from the BGA package.

As seen in FIG. 3B the end of the socket electrical contact 21 is cupped such that the portion of the socket contact making contact with the ball is at or above the imaginary equator of the ball near where the ball is connected to the body of the BGA package itself. This directed pinching action of the ends of the socket contacts and the hole side wall pinches the ball contacts so as to prevent vertical movement of the ball contacts and the BGA package itself.

Figure 4:
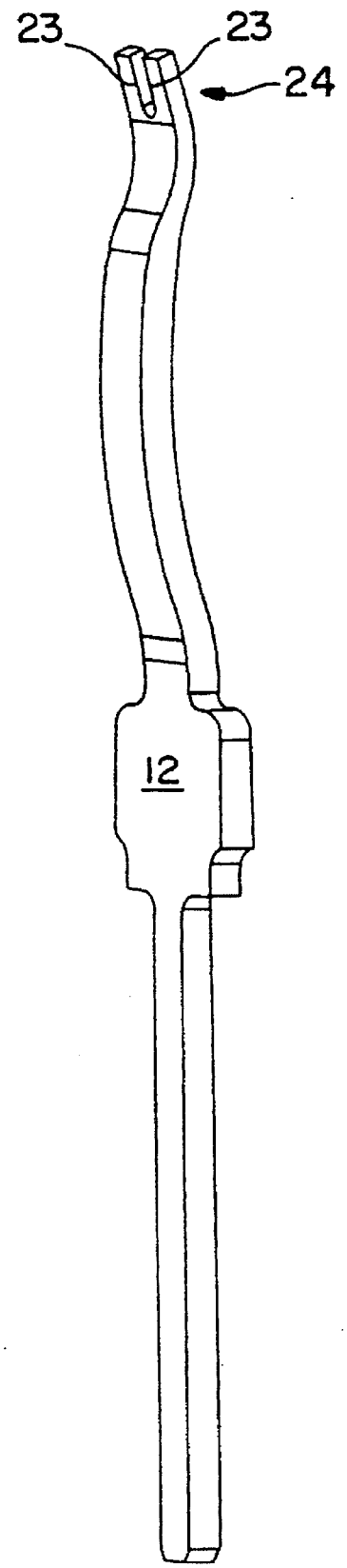
FIG. 4 is a perspective view of an individual bifurcated socket contact with sharp edges.

FIG. 4 is perspective view of a representative socket contact 12. The cupped or angled end 24 is bifurcated or forked. There are sharp edges 23 that penetrate any oxide layer on the BGA ball to assure good electrical contact between the ball contacts and the socket contacts.

Figure 5:
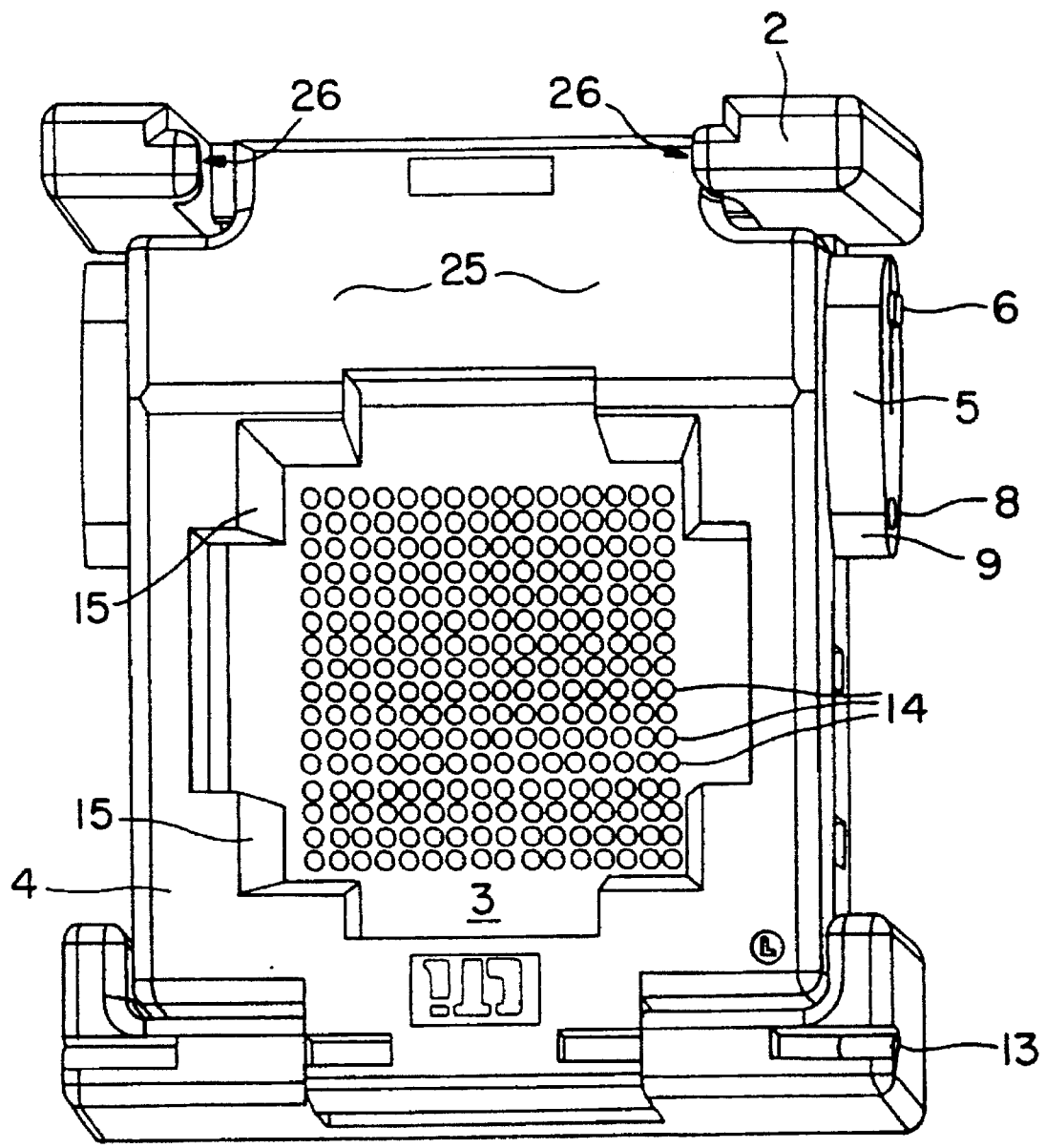
FIG. 5 is a top view of a BGA test and burn-in socket showing the alignment surfaces of the top structure frame.

FIG. 5 shows a top view of the frame lever arm or lid 4. The chamfered guide surfaces 15 engage the corners of the BGA package to guide the ball contacts into alignment with the holes 14 in the slidable top plate 3. The socket is in the open position with the lid 4 flat against the top plate 3. This is evident since the lid has moved away from the stops 26 that limit the upward travel of the lid via the torsional spring action described before. A force is pressing down on the surface 25 against the torsional springs for the lid to be flat against the slidable top plate.

Figure 6A:
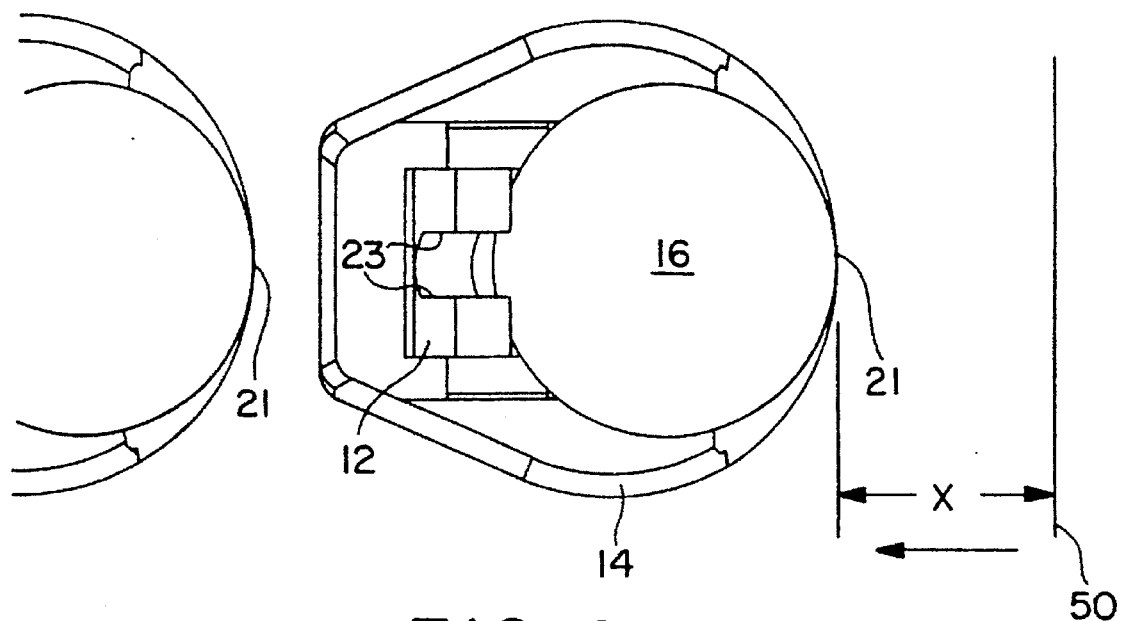
FIG. 6A is a top view of an individual package ball contact, socket contact, and top plate in the engaged position.
Figure 6B:
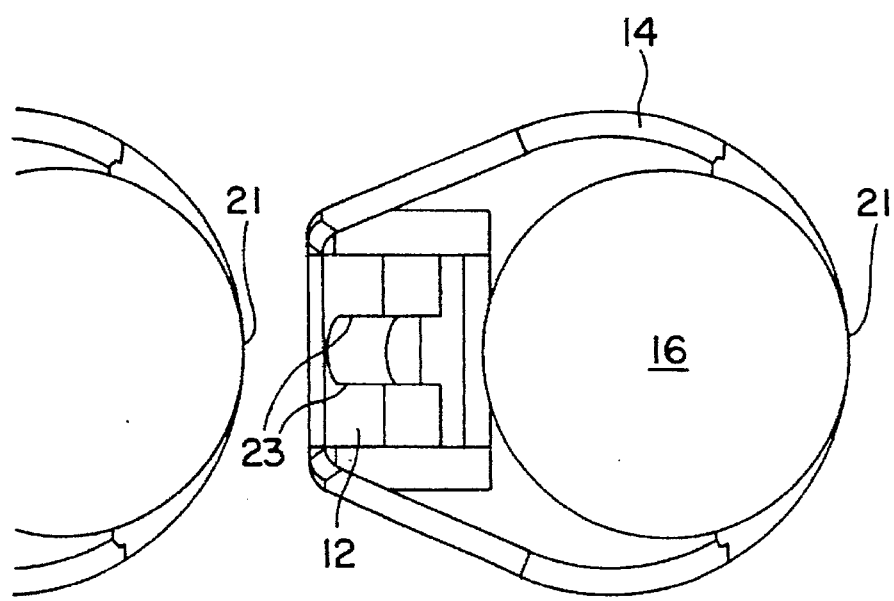
FIG. 6B is a top view of an individual package ball contact, socket contact, and top plate in the open position;.

FIG. 6A and 6B are top views of the openings and holes 14 in the slidable top plate 3. FIG. 6A shows the socket in the engaged position and FIG. 6B in the open position. There is a ball contact 16 and a socket contact 12 shown. In FIG. 6A the line 50 represents the position of the hole side wall surface 21 with the socket in the open position. The distance X is the movement caused by the cam axle rotation as described above. The surface 21 contacts the ball and moves the ball into contact with the socket contact 12 and then moves the combination ball and socket contact farther deflecting the socket contact 12. The sharp edges 23 contact the ball making reliable electrical connections.

It will now be apparent to those skilled in the art that other embodiments, improvements, details and uses can be made consistent with the letter and spirit of the foregoing disclosure and within the scope of this patent; which is limited only by the following claims, construed in accordance with the patent law, including the doctrine of equivalents.

What is claimed is:

1. A socket for ball grid array integrated circuit packages comprising:

a housing with a top structure with an opening large enough to allow the grid array package to pass through with the ball contacts facing said socket, the lower surfaces of the ball contacts defining a first plane, a slidable top plate with through holes arranged to receive said ball contacts, a plurality of electrical contacts fixed to said socket with a first end having at least one edge arranged to mate with said ball contacts, and where said first ends extending into said holes in the top plate from a direction opposite the ball contacts, and where the distance between the electrical contact and the edges or walls of through hole define an opening, a cam axle means arranged to provide a displacement to said slidable plate in a direction parallel with said plane, where said cam axle acts to reduce said hole openings, such that interposing BGA ball contacts are pushed into said socket electrical contacts and captured between the hole edges and contact first ends, a compression spring means for driving the said plate against the said cam axle such that in the open position the cam axle lower profile provides openings between the edges of said holes and each of said electrical contacts suitable for removal and insertion of said package ball contacts, a torsion spring means of motivating the cam axle rotation from the open position to the actuated or cam thick position thereby moving the slidable plate such that said balls are driven into electrical continuity with said electrical contacts.

2. A socket as defined in claim 1 wherein said means for driving the top plate comprises a camming surface and an actuator.

3. A socket as defined in claim 1 wherein said first end of said electrical contact comprises a cupped surface such that a detent action occurs as cupped surfaces engage the top of the ball contacts above the equator of each ball contact such that the ball grid array integrated circuit package is retained in said socket.

4. A socket as defined in claim 1 wherein said edges on said first end of said electrical contacts comprises a bifurcated or forked extension with two edges arranged to mate with and engage said ball contacts above the balls' equators.

5. A socket as defined in claim 1 wherein said top structure comprises: a frame arranged on the periphery of the socket such that the frame does not interfere with the open top insertion and extraction of the integrated circuit; and a body where said frame has an edge hinged to said body whereby said hinged frame defines a first position where said grid array package may be inserted into said socket, and a second position where said grid array package is retained in said socket, and where said package is guided and aligned by chamfered surface on said frame in said first position, but when said frame is in said second position, said frame does not contact said package or said ball contacts.

6. A socket for ball grid array integrated circuit packages as defined in claim 5 wherein said means for driving said top plate comprises: a cam hinged to said body where said cam defines a first cam position and a second cam position, where said cam in said first position has a lower profile allowing the top plate to slid toward it to enlarge said openings allowing the balls to enter, and where said second position drives the top plate reducing said openings thereby retaining said balls, and where said cam contacts said frame and is actuated by said frame, and where said frame drives said cam such that said frame first position corresponds to said cam first position and said frame second position corresponds to said cam second position.

7. A socket for ball grid array integrated circuit packages comprising:

a body, a frame hinged to said body and said frame arranged on the periphery of the socket such that the frame does not interfere with the insertion and extraction of the integrated circuit package, and where said hinged frame defines a first position where said integrated circuit package may be inserted into said socket, and a second position where said integrated circuit package is retained in said socket, and where said integrated circuit package is guided and aligned by chamfered surfaces on said frame in said first position, but, when said frame is in second position, said frame does not contact said package or said ball contacts, said lower ball surfaces on contacts of inserted package defining a plane, a slidable top plate with through holes arranged to receive said ball contacts, a plurality of electrical contacts fixed to said socket with cupped or angled first bifurcated ends each having at least two edges adapted to mate with said ball contacts surface, and where each said angled first bifurcated end is adapted to contact said ball contact above the equator of said ball contacts, and where said first bifurcated ends extend into said holes in the top plate from a direction opposite the ball contacts, and where the distance between the electrical contact and the edges of the through hole define an opening, cam axle with a camming surface and actuator for rotating cam to a low profile position to allow for a spring means to move the top plate toward the cam enlarging said openings for accepting the ball contacts, and wherein with said ball contacts inserted into said openings and with said torsion spring forces rotating the cam to the thick position, the cam displacing said top plate to reduce said openings securing said ball contacts between said edges of said electrical contacts and the opposing surfaces of said holes thereby retaining the ball grid array package in said socket.

* * * * *